(12) United States Patent
Dimri

(10) Patent No.: US 9,891,279 B2
(45) Date of Patent: *Feb. 13, 2018

(54) MANAGING IR DROP

(71) Applicant: STMicroelectronics International N.V., Amsterdam (NL)

(72) Inventor: Ajay Kumar Dimri, Greater Noida (IN)

(73) Assignee: STMicroelectronics International N.V., Amsterdam (NL)

(*) Notice: Subject to any disclaimer, the term of this patent is extended or adjusted under 35 U.S.C. 154(b) by 700 days.

This patent is subject to a terminal disclaimer.

(21) Appl. No.: 13/919,884

(22) Filed: Jun. 17, 2013

(65) Prior Publication Data

US 2014/0372823 A1 Dec. 18, 2014

(51) Int. Cl.
G01R 31/28 (2006.01)
G01R 31/317 (2006.01)
G01R 31/3185 (2006.01)

(52) U.S. Cl.
CPC ......... G01R 31/31726 (2013.01); G01R 31/318552 (2013.01)

(58) Field of Classification Search
CPC ...... G01R 31/318552; G01R 31/31726; G01R 31/31727
USPC .................. 714/733, 731, 726–727
See application file for complete search history.

(56) References Cited

U.S. PATENT DOCUMENTS

| | | | |
|---|---|---|---|
| 4,894,830 A * | 1/1990 | Kawai | 714/731 |
| 6,313,683 B1 * | 11/2001 | Block | G01R 31/30 327/295 |
| 6,384,657 B1 | 5/2002 | Dobos | |
| 6,614,263 B2 * | 9/2003 | Nadeau-Dostie | G01R 31/3187 326/16 |
| 6,847,255 B2 | 1/2005 | Petrovic et al. | |
| 6,919,749 B2 | 7/2005 | Alon et al. | |
| 7,210,082 B1 | 4/2007 | Abdel-Hafez et al. | |
| 7,746,136 B2 | 6/2010 | Demone | |
| 7,937,634 B2 | 5/2011 | Almukhaizim et al. | |
| 8,321,729 B2 | 11/2012 | Saxena et al. | |
| 8,917,123 B2 * | 12/2014 | Bahl | H03K 3/012 327/144 |
| 2003/0115524 A1 * | 6/2003 | Johnston et al. | 714/726 |
| 2006/0248422 A1 * | 11/2006 | Puvvada et al. | 714/733 |
| 2008/0091995 A1 | 4/2008 | Baik et al. | |
| 2008/0092002 A1 | 4/2008 | Shimooka | |

(Continued)

OTHER PUBLICATIONS

Bahl et al., "Peak Power Reduction Technique for Low Power Scan Test," Technology Research and Development STMicroelectronics, Nokia, India. 10 pages, 2007.

(Continued)

*Primary Examiner* — Guy Lamarre

(74) *Attorney, Agent, or Firm* — Seed IP Law Group LLP

(57) ABSTRACT

An apparatus has a large block of synchronous logic arranged to include a first partition and a second partition. The first partition is configured to receive a first clock signal during a functional mode and during a test mode. The second partition is configured to receive the first clock signal during the functional mode, and the second partition configured to receive a second clock signal during a test mode. The second clock signal has the same frequency as the first clock signal. The second clock signal has a different phase from the first clock signal.

20 Claims, 7 Drawing Sheets

(56) References Cited

U.S. PATENT DOCUMENTS

| | | |
|---|---|---|
| 2008/0172587 A1 | 7/2008 | Douskey |
| 2008/0284476 A1 | 11/2008 | Kwan et al. |
| 2009/0033381 A1 | 2/2009 | Lee et al. |
| 2010/0117706 A1 | 5/2010 | Stojanovic et al. |
| 2010/0174957 A1* | 7/2010 | Winslow et al. ............. 714/727 |
| 2010/0211839 A1 | 8/2010 | Almukhaizim et al. |
| 2010/0287430 A1* | 11/2010 | Wang ............... G01R 31/31704 714/731 |
| 2011/0018596 A1 | 1/2011 | Lee et al. |
| 2011/0140734 A1 | 6/2011 | Miyase et al. |
| 2012/0166860 A1 | 6/2012 | Khullar et al. |

OTHER PUBLICATIONS

Li et al., "On Reducing Both Shift and Capture Power for Scan-Based Testing," 6 pages, 2008.
Ravikumar et al., "Test Strategies for Low Power Devices," *EDAA 2008*, 6 pages.
Vorisek et al., "At-speed Testing of SOC ICs" *IEEE Proceedings of the Design, Automation and Test in Europe Conference Exhibition Designers' Forum*, 2004, 6 pages.

* cited by examiner

MANAGING IR DROP

BACKGROUND

Technical Field

The present disclosure generally relates to synchronous circuits. More particularly, but not exclusively, the present disclosure relates to methods and devices to manage at least one scan clock in synchronous circuits.

Description of the Related Art

Some circuits comprise hundreds of thousands of synchronous elements (e.g., flip flops) or more that share the same clock signal. For example, System on Chip (SoC) devices typically include large synchronous blocks of logic. Often, these circuits require testing. Testing methods may comprise a scan stage where values are propagated through the circuit on one or more clock pulses, and a capture stage where output values are obtained for analysis. These testing methods, particularly during SHIFT operations, pose challenges.

Many tests are designed to shift all of the flip flops in the device at the same time. During the shift, when all of the flip flops are clocked together, the large amount of switching causes a lot of current to be drawn from the power supply. Clock signal lines become susceptible to instantaneous voltage drop around the shift clock edges when too many devices are simultaneously clocked. Stated differently, due to an IR Drop during a scan shift operation, the device may undergo an instantaneous drop in the voltage around the shift clock edges below a minimum core signoff voltage. The instantaneous voltage drop will slow down clock and data signals, which creates skew between the signals, thus causing timing violations (setup/hold) and thereby leading to failures during the load and unload stages.

When a manufacturing production test indicates false failures, the false failures can have impact on the yield. Accordingly, manufacturers generally prefer to keep the IR Drop in all modes, including test modes, within the device functional mode limits for which signoff has been done. One determinative point in a logic scan is when all of the scan chain flip flops must are clocked during a Scan Shift stage in a test mode. A Scan Shift stage is unlike operations in a Functional Mode (e.g., a Scan Capture stage) where clock gating can be utilized to reduce the switching power. Instead, in a large SoC, a single clock domain may itself provide clock signals for most or all of the logic of the entire chip.

In one example, 80% of the flip flops belong to one single clock domain itself. In this case cases, IR drop management is challenging because all the flops will be clocked during the shift operation as they belong to a single clock domain. In the devices that use wire bond packages it will be even more critical than the flip chip.

To avoid problems with clock lines that are too heavily loaded, one conventional technique that is widely employed in the industry is to partition the large synchronous device and test only certain logic at a time. When one partition is being clocked, other partitions are switched off. In this technique, if there are two partitions, the entire synchronous device can be tested with a two pass strategy. Another solution is to toggle only a percentage of all the scan flops during the shift operation.

To carryout these conventional solutions, a large design is partitioned into smaller, manageable, hierarchical scan partitions. Each scan partition has its own compressor/decompressor. In order to reduce the Scan Stage IR drop during a shift operation and to also benefit the Capture Stage power, only one or a few scan partitions are tested at a time. In this way, switching activity is limited to a percentage of the total device flops, which prevents all of the flip flops from being clocked at the same. Thus, the logic of an entire chip can be tested by breaking the scan test into smaller tests targeting different scan partitions at different times. The entire chip is tested by breaking the scan test into smaller tests targeting different scan partitions at different times. In other words the complete device scan-based testing is serialized.

FIG. 1 shows a system on chip 10 with four clock domains, clock domain W 2, clock domain X 4, clock domain Y 6, and clock domain Z 6. Clock domain W is configured to receive an input clock W signal 12. Clock domain clock domain X is configured to receive an input clock X signal 14. Clock domain Y is configured to receive an input clock Y signal 16. Clock domain Z is configured to receive an input clock Z signal 18. Clock domains W, X, Y, and Z each comprise synchronous circuitry.

In some embodiments the clock domain Z may comprise much more circuitry than the other clock domains, alone or combined. For example, in some embodiments, the clock domain Z may comprise more than 80% of the total synchronous elements (e.g., flip flops) within the system on chip 10 and the clock domains W, X, and Y may comprise the remaining 20% or less of the synchronous circuitry.

In other embodiments, the system on chip may comprise only one clock domain. Some testing methods, for example, scan testing through Automatic Test Pattern Generation (ATPG), may require all the synchronous elements within a clock domain to be clocked on the same clock cycle. Clocking all synchronous elements on the same clock may not occur during the normal function of the circuitry, due for example to design consideration such as clock gating, but such testing may provide efficiency or useful information. Considering embodiments where the SoC comprises only one clock domain, clocking all synchronous elements in the SoC 10 on the same clock may result in the power requirement of the clock domain exceeding its design parameters, which may in turn result in an instantaneous voltage (or IR) drop across the clock domain. The instantaneous voltage drop may slow the clock and/or data signals which may create a skew between them and cause timing violations. These timing violations may lead to failures during load or unload stages and reduce the yield.

In order to address the possible timing violations, the SoC 10 of FIG. 1 is organized into multiple clock domains and multiple scan partitions. The SoC 10 executes the shift operation switching activity in two scan partitions. Synchronous devices (such as flip flops) belonging to clock domains W, X, and Y are grouped into a first scan partition Pwxy. A second scan partition Pz includes the synchronous devices of clock domain Z. Each of the two scan partitions has its own compressor/decompressor.

During the ATPG, one scan partition is enabled at a time. For example, during the first pass, the partition Pwxy of clock domains W, X, Y is active, while the second scan partition Pz is inactive. In a subsequent pass, the scan partition Pz is on while scan partition Pwxy is off. In this way, the entire device can be tested while the shift operation switching activity is controlled.

BRIEF SUMMARY

In accordance with some embodiments described herein, scan clocking circuitry in integrated circuits is restructured in such a way that an entire synchronous design can be tested in one pass. In such embodiments, a shift operation IR drop is effectively contained such that the testing is reliable. In these embodiments, which may include integrated circuits having a large number of synchronous devices (for example, 200K flip flops, 500K flip flops, more than 1M flip flops), clock domains are grouped into a plurality of partitions for shift clocking, and the clock domains retain their original clock patterns and usage during capture. The scan clocks of multiple partitions can be derived from the same clock or from different clocks (e.g., one or multiple external dedicated clocks).

In cases where a dedicated scan clock is configured for each partition, the scan clocks can be staggered by automated test equipment (ATE) such that the switching circuit operations can be distributed, thereby reducing the IR drop. In other cases, where there is only one scan clock (e.g., due to the pin availability constraint for example), scan clock signals can be distributed and delayed internally. In this way an entire integrated circuit or other large portion of synchronous circuitry can be reliably tested in one pass while saving test time and avoiding unnecessary design complexities.

According to an aspect, there is provided an apparatus having a large block of synchronous logic, the large block of synchronous logic arranged to include at least a first partition and a second partition, the first partition configured to receive a first clock signal during a functional mode and the first partition configured to receive the first clock signal during a test mode, the second partition configured to receive the first clock signal during the functional mode and the second partition configured to receive a second clock signal during a test mode, wherein said second clock signal has a same frequency as said first clock signal and said second clock signal has a different phase from said first clock signal.

The second partition may be configured to receive said second clock signal during a scan stage in the test mode and said first clock signal during a capture stage in the test mode.

The apparatus may further comprise switching circuitry configured to receive said first clock signal, said second clock signal, and a control signal, the switching circuitry further configured to output one of said first clock signal and said second clock signal in dependence on said control signal.

The phase difference between said first clock signal and said second clock signal may be one of: greater than zero and less than $\pi$; equal to $\pi$; and greater than $\pi$ and less than $2\pi$.

The rising and falling edges of the second clock signal may be more than 3 nanoseconds from the rising and falling edges of the first clock signal.

In some embodiments, the large block of synchronous logic includes at least 200,000 flip flops, and in some other embodiments, the large block of synchronous logic includes at least 500,000 flip flops.

The apparatus may be further configured to operate in a normal mode, wherein said first clocked region and said second clocked region receive a same clock signal.

The apparatus may be further configured such that wherein said large block of synchronous logic includes at least one further partition configured to receive a respective at least one further clock signal, said at least one further clock signal having a frequency different from said first and second clock signals.

The apparatus may further comprise delay circuitry configured to receive said first clock signal, generate said second clock signal by delaying said first clock signal by a time period, and output said second clock signal.

An integrated circuit may comprise the apparatus.

According to another aspect there is provided a method for testing an apparatus providing a first clock signal to a first partition of a large block of synchronous logic, and providing a second clock signal to a second partition of the large block of synchronous logic, wherein said second clock signal has a same frequency as said first clock signal and said second clock signal has a different phase from said first clock signal.

The method may further comprise receiving at said second partition said second clock signal during a scan stage and receiving at said second partition said first clock signal during a capture stage.

The method may further comprise receiving a mode signal, said first clock signal and said second clock signal at switching circuitry; and outputting one of said first clock signal and said second clock signal in dependence on said mode signal at said signal circuitry.

The phase difference between said first clock signal and said second clock signal may be between zero and $2\pi$.

The method may further comprise delaying said second clock signal such that rising edges of the second clock signal are more than 2 nanoseconds from the rising edges of the first clock signal.

The first mode may be a scan testing mode and said second mode may be a capture mode.

The method may further comprise operating in a normal mode, and providing a same clock signal to the first partition and the second partition while operating in the normal mode.

The method may further comprise receiving at at least one further clocked region a respective at least one further clock signal, wherein said at least one further clock signal has a different frequency to said first and second clock signals.

The method may further comprise: receiving said first clock signal at a delay circuitry; generating said second clock signal by delaying said first clock signal by a time period at said delay circuitry; and outputting said second clock signal at said delay circuitry.

According to another aspect there is provided an integrated circuit having a large block of synchronous logic, the large block of synchronous logic arranged to include at least a first partition and a second partition, the first partition configured to receive a first clock signal and the second partition configured to receive a second clock signal, and a switching circuit, the switching circuit configured to receive the first clock signal at a first node, the switching circuit configured to receive a delayed clock signal at a second node, and the switching circuit configured to pass either the first clock signal or the delayed clock signal as the second clock signal from an output node.

The integrated circuit may include a delay circuit, the delay circuit configured to provide the delayed clock signal wherein the delayed clock signal has a same frequency as the first clock signal and the delayed clock signal has a different phase from said first clock signal.

The delay circuit included in the integrated circuit may include a plurality of serially coupled buffers.

According to another aspect, the integrated circuit includes a first terminal configured to receive the first clock signal from a first source external to the integrated circuit and a second terminal configured to receive the delayed clock signal from a second source external to the integrated circuit.

The large block of synchronous logic in the integrated circuit may include at least one further partition configured to receive a respective at least one further clock signal, said at least one further clock signal having a phase different from the first clock signal and the second clock signal.

The switching circuit in the integrated circuit may be configured to pass the delayed clock signal to the output node during a scan stage and the switching circuit may be configured to pass the first clock signal to the output node during a capture stage.

In the integrated circuit, the second partition may include at least 80 percent of the synchronous logic of the large block of synchronous logic.

According to another aspect there is provided an apparatus comprising means for providing a first clock signal to a first clocked region; and means for providing a second clock signal to a second clocked region; wherein said second clock signal has a same frequency as said first clock signal and a different phase as said first clock signal.

The apparatus may comprise means for receiving at said second clocked region said second clock signal in a first mode and said first clock signal in a second mode.

The apparatus may comprise means for receiving a mode signal, said first clock signal and said second clock signal at switching circuitry; and means for outputting one of said first clock signal and said second clock signal in dependence on said mode signal at said signal circuitry.

The phase difference between said first clock signal and said second clock signal may be one of: greater than zero and less that $\pi$; equal to $\pi$; and greater than $\pi$ and less than $2\pi$.

The rising and falling edges of the second clock signal may be substantially apart from the rising and falling edges of the first clock signal.

The first mode may be a scan testing mode and said second mode may be a capture mode.

The apparatus may comprise means for operating in a normal mode, wherein said first clocked region and said second clocked region receive a same clock signal.

The apparatus may comprise means for receiving at at least one further clocked region a respective at least one further clock signal, wherein said at least one further clock signal has a different frequency to said first and second clock signals.

The apparatus may comprise: means for receiving said first clock signal at a delay circuitry; means for generating said second clock signal by delaying said first clock signal by a time period at said delay circuitry; and means for outputting said second clock signal at said delay circuitry. It should be appreciated that at least any one of the features discussed in relation to any of the aspects may be used in conjunction with one or more other aspects.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

Figure 1:
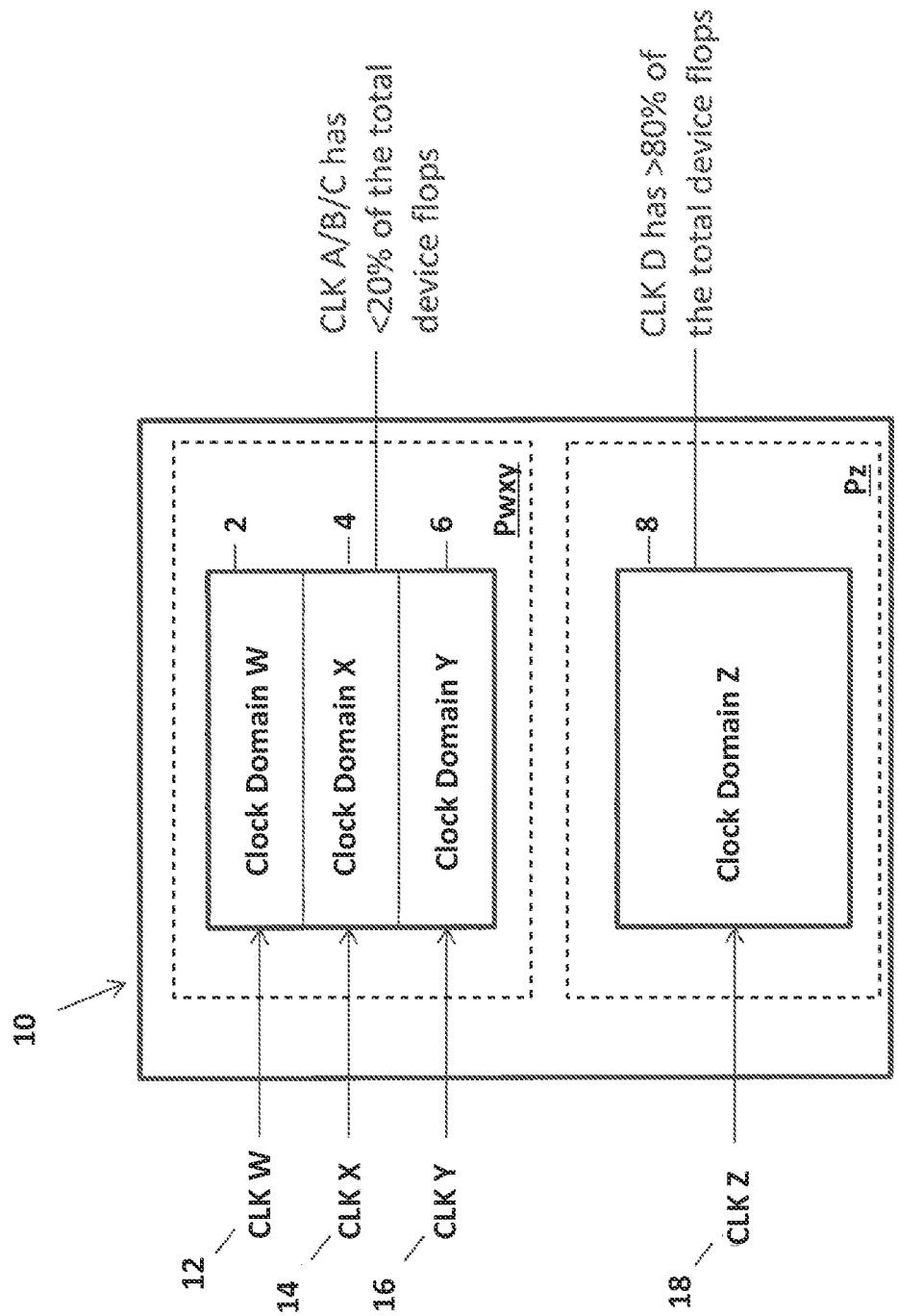
FIG. 1 shows a system on chip comprising four clock domains.

The System on Chip (SoC) 10 of FIG. 1 includes four clock domains W, X, Y, and Z arranged in two scan partitions Pwxy and Pz. The SoC 10 addresses instantaneous voltage drop problems that may arise when a large number of synchronous devices (e.g., flip flops) are shifted on the same clock. Although the circuitry of FIG. 1 controls the shift operation switching activity very effectively, the approach in FIG. 1 has an inherent draw back. Due to the serialized testing of Pwxy and Pz, possible interface faults between Pwxy and Pz go untested, which is generally more relevant to an "at speed" or "delay" fault mode.

A solution to the problems caused by serialization addresses several questions. "What is an effective mechanism to test interface faults of the clock partitions Pwxy and Pz?" "What if the clock domain Z in FIG. 1 includes so many synchronous elements that a scan stage causes an undesirable instantaneous voltage drop?" "What if an SoC includes more than several hundred thousand synchronous elements?"

If both partitions of FIG. 1, Pwxy and Pz, are enabled or if a single partition includes too many synchronous devices, the original problem arises where an increased IR drop during shift leads to the potential failures at silicon. If more than two partitions are created, the further splitting will increase the test time due to more than two ATPG passes and more than two patterns to manage.

The increase in test time may become prohibitively penalizing (e.g., 2×, 3×, or more), especially in the case of very large designs where the synchronous device count is large (e.g., flip flop count>500K). Furthermore, partitioning to address scan problems creates design complexities such as the need for multiple compressors or more complex compressor design. Another drawback of the strategy employed in the SoC 10 of FIG. 1 is that since partitions Pwxy and Pz are tested separately, interface faults between clock domains may not get tested reliably.

In the present disclosure, a solution is proposed to address the problems associated with the operation of conventional scan circuits during a test mode. The solution includes devices and methods that are used in a test mode to execute a shift and scan operations such as start stages, scan stages, capture stages, and unload stages. In the embodiments described herein, during the test mode, one or more large synchronous clock domains are partitioned into one or more clock domains for the shift operation, and the same partitioning and clock domains that are used during the functional mode are used during the capture stage of the test mode. In such embodiments, during the shift operation, multiphase clocks can be applied to scatter the switching activity thereby lowering current peak around the shift clock edges.

Figure 2:
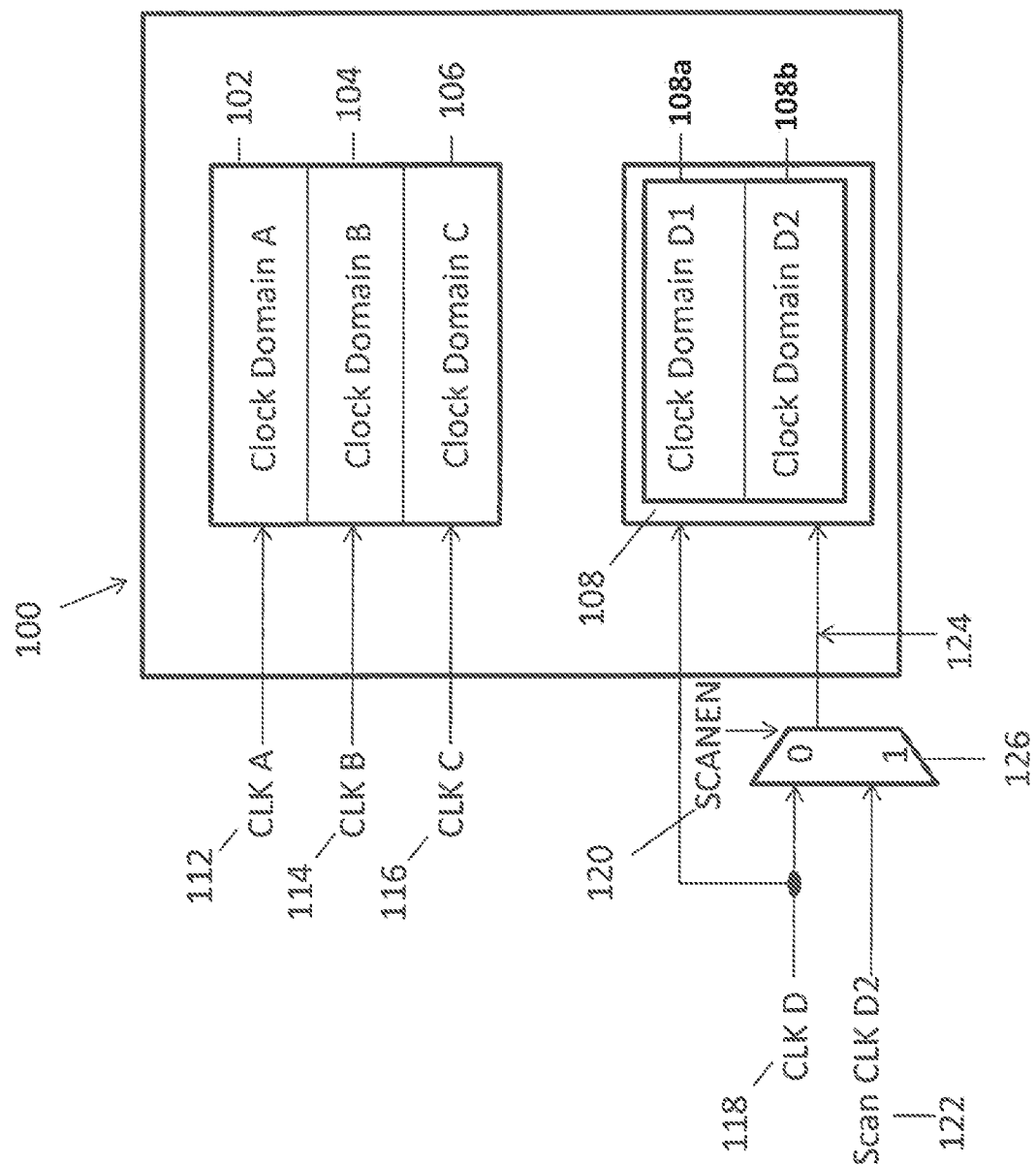
FIG. 2 shows a system on chip comprising four clock domains wherein one of the clock domains has been partitioned.

FIG. 2 shows a System on Chip (SoC) 100 which bears some similarities to the SoC 10 of FIG. 1, but SoC 100 differs from SoC 10 in many ways. FIG. 2 shows a system on chip 100 with five clock domains. With respect to similarities, clock domain A 102, clock domain B 104, and clock domain C 106, may be constructed the same or similar to clock domains W, X, and Y of FIG. 1. Clock domains A, B, and C have synchronous circuitry. In some embodiments, clock domains A, B, and C include less than 20% of the synchronous circuitry of SoC 100, and in other embodiments, these clock domains include more than 20% of the synchronous circuitry of SoC 100. Clock domains A, B, and C receives clock signal inputs CLK A 112, CLK B 114, and CLK C 116 respectively.

A large block of synchronous circuitry 108 in FIG. 2 may have functional logic that is similar to the functional logic of the clock domain Z in FIG. 1. In some embodiments the synchronous circuitry 108 may comprise much more circuitry than the other clock areas of SoC 100, alone or combined. That is, in some embodiments, the synchronous circuitry 108 may comprise more than 80% of the total synchronous elements (e.g., flip flops) within SoC 100.

Different from the SoC 10 of FIG. 1, the SoC 100 of FIG. 2 includes a large block of synchronous circuitry 108 that is partitioned into a first clock domain D1 108a and a second clock domain D2 108b. Clock domain D1 is configured to receive clock signal CLK D 118 as an input clock. Clock domain D2 is configured to receive clock signal 124 as an input clock. Clock signal 124 is received as an output from a multiplexer 126. Multiplexer 126 is configured to receive CLK D as an input at its zero (0) input terminal. Multiplexer 126 is configured to receive a scan clock signal CLK D2 122 as an input at its one (1) input terminal. Multiplexer 126 is configured to receive a selection signal SCANEN 120 at its control input terminal.

Figure 3:
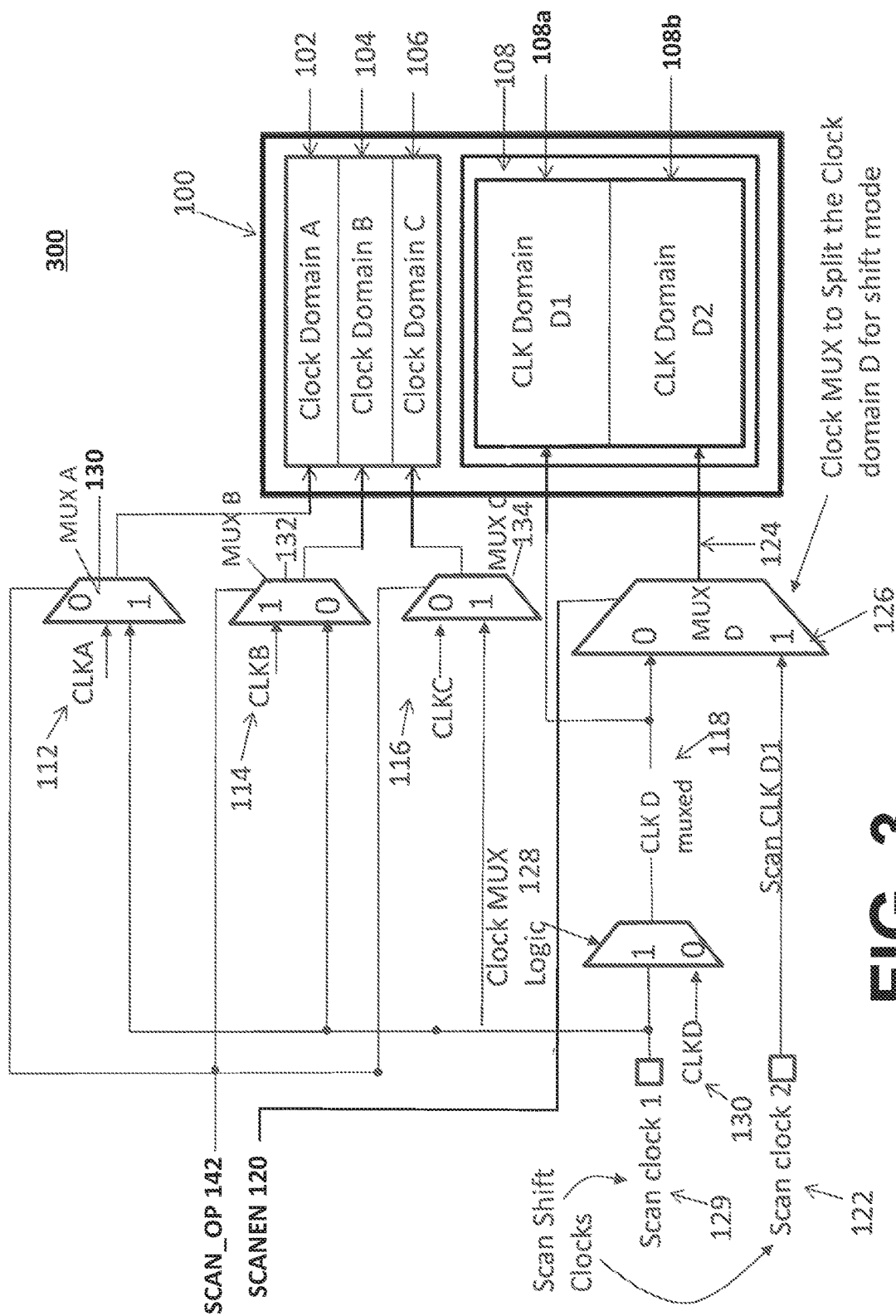
FIG. 3 shows a test configuration for a system on chip.

FIG. 3 shows a system 300 comprising an SoC 100 as described in FIG. 2. A first multiplexer MUX A 130 is configured to receive an input clock signal CLK A 112 at its zero input terminal and a first Scan Clock 1 signal 129 at its one input terminal. MUX A is further is further configured to receive a Scan Operation selection signal 142 at its control input terminal and to provide an output clock signal 130, which is received as an input by the clock domain A 102.

Second and third multiplexers MUX B 132 and MUX C 134 are configured to receive an input clock signal CLK B 114 and an input clock signal CLK C 116 at their respective zero input terminals. The first Scan Clock 1 signal 129 is received by MUX B and MUX C at their respective one input terminals, and Scan Operation selection signal 142 is received at the control input terminals. MUX B is further configured to provide an output clock signal 132, which is received as an input by clock domain B 104. MUX C is further configured to provide an output clock signal 134, which is received as an input by clock domain C 106.

A fourth multiplexer MUX D 126 is configured to receive a multiplexed input clock signal D 118 at its zero input terminal and a second Scan Clock 2 signal 122 at its one input terminal. The multiplexed input clock signal D is also coupled, directly or through intervening circuitry, to the first clock domain D1. MUX D (i.e., multiplexer 126) is configured to receive the selection signal SCANEN 120 at its control input terminal. MUX D is further configured to provide the output a signal 124, which is received as an input by the second clock domain D2.

Clock multiplexing logic 128 is configured to receive an input clock signal CLK D 130 at its zero input terminal and the first Scan Clock 1 signal 129 at its one input terminal. The clock multiplexing logic 128 is configured to provide the multiplexed clock signal D 118 at its output, which is received at the zero input terminal of MUX D and at the first clock domain D1.

In some embodiments the clock signals CLK A, CLK B, CLK C, and CLK D are internally generated by a functional clock or some other mechanism. In some embodiments, the scan shift clocks, Scan Clock 1 and Scan Clock 2, are applied directly at external device pins or generated internally by an internal clock mechanism. In some embodiments, MUX D may be configured to split the application of clock signals to clock domain D1 and clock domain D2 for the shift, operation as described herein.

Figure 4:
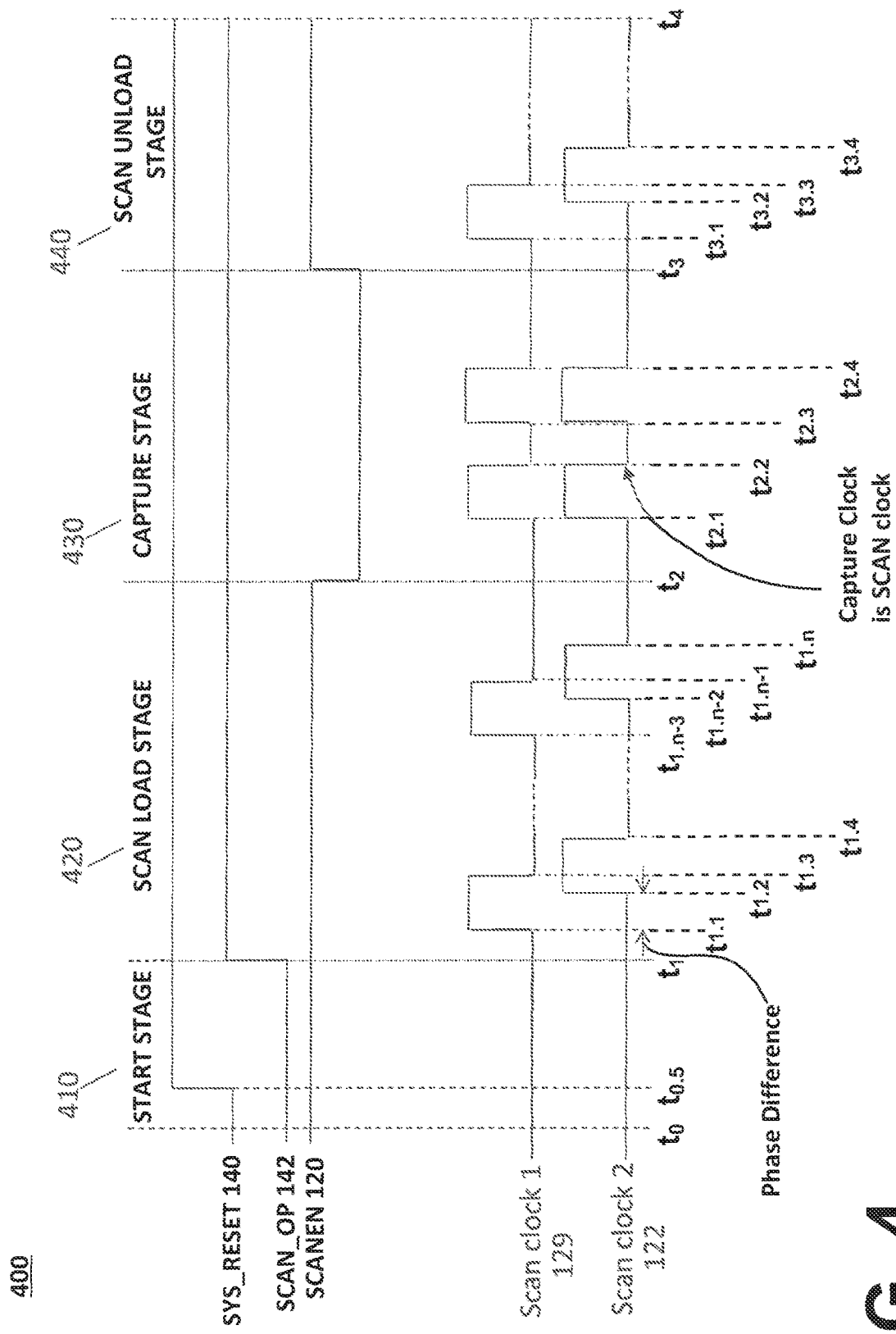
FIG. 4 shows a timing diagram for the testing of a system on chip.

The operation of the circuits of FIG. 3 is explained in relation to the timing diagram shown in FIG. 4.

FIG. 4 is a timing diagram 400 that illustrates relative signals generated and, in addition or as an alternative, passed with some embodiments described herein. The operations of FIG. 4 may be split into four stages, which are a Start Stage 410, a Load Stage 420, a Capture Stage 430 and an Unload Stage 440. The Start Stage 410 begins at time $t_0$ and ends at time $t_1$. The Load Stage 420 begins at time $t_1$ and ends at time $t_2$. The Capture Stage 430 begins at time $t_2$ and ends at time $t_3$. The Unload Stage 440 begins at time $t_3$ and ends at time $t_4$.

The timing diagram of FIG. 4 shows the transitions of signals SYS_RESET 140, SCAN_OP 142, SCANEN 120, Scan Clock 1 129 and Scan Clock 2 122.

At time $t_0$, the Start Stage begins. A system reset signal SYS_RESET 140 transitions from a low value to a high value at time $t_{0.5}$, and the system is reset. The SCAN_OP signal 142, Scan Clock 1 signal 129 and Scan Clock 2 signal 122 are at a low value; the SCANEN signal 120 is at a high value.

At time $t_1$, the SCAN_OP signal 142 transitions from a low value to a high value and the system enters the Scan Load Stage 420. In the Scan Load Stage, the Scan Clock signals 129, 122 will transition out of phase. At time $t_{1.1}$ the Scan Clock 1 signal 129 transitions from a low value to a high value, and at time $t_{1.2}$, the Scan Clock 2 signal 122 transitions from a low value to a high value. The Scan Clock signal 129 transitions from a high value back to a low value at time $t_{1.33}$ and the Scan Clock 2 signal 122 transitions from a high value back to a low value at time $t_{1.4}$. The Scan Clock 1 and Scan Clock 2 signals transition (out of phase) from low to high and back to low again at times t $t_{1.n-3}$, $t_{1.n-2}$, $t_{1.n-1}$, and $t_{1.n}$.

At time $t_2$, the SCANEN signal 120 transitions from a high value back to a low value, and the system enters the Capture Stage 430. In the Capture Stage, the Scan Clock 1 and Scan Clock 2 signals 129, 122 will transition in phase from low to high and back to low again. At time $t_{2.1}$, both the Scan Clock 1 and Scan Clock 2 signals 129, 122 transition, in phase, from a low value to a high value. At times $t_{2.2}$, $t_{2.3}$, and $t_{2.4}$, the Scan Clock 1 and Scan Clock 2 signals will transition, in phase, from the high value to a low value, from the low value to a high value, and from the high value back to a low value.

The Scan Unload Stage begins at time $t_3$. At time $t_3$, the SCANEN signal 120 transitions back to a high value. The Scan Clock signals 129, 122 transition, out of phase, from low to high and back to low again at times $t_{3.1}$, $t_{3.2}$, $t_{3.3}$, and $t_{3.4}$.

The system reset signal SYS_RESET 140 is arranged to reset the circuitry within the clock domains. When the Scan Operation signal SCAN_OP 142 transitions to indicate that the system 300 comprising SoC 100 has entered a Scan Load stage, the Scan Clock 1 provides a first clock pulse, which passed through multiplexer 128 and received by the clock domain D1. The Scan Clock 1 pulse is also received by MUX A 130, MUX B 132, MUX C 134 and MUX D 126. The SCAN_OP signal 142 is high, so MUX A 130, MUX B 132, and MUX C 134 pass the Scan Clock 1 signal to clock domains A, B, and C. The SCANEN signal 120 is high, so MUX D 126 passes the Scan Clock 2 signal 122 to clock domain D2.

The Scan Clock 2 signal 122 has the same frequency as the Scan Clock 1 signal 129, but Scan Clock 2 is delayed with respect to Scan Clock 1. In some cases, Scan Clock 1 and Scan Clock 2 are derived from the same source. In some cases, Scan Clock 2 is delayed by between zero and one half of the length of one clock cycle of Scan Clock 1. The delay (i.e., phase difference) between Scan Clock 1 and Scan Clock 2 permit changes across the Domain D1-Domain D2 interface to have a chance to settle before a subsequent edge transition.

In some embodiments, the scan phase difference may comprise one or more clock cycles. After a scan operation ends, the SCANEN signal 120 transitions to a low value, and the Capture Stage is entered. In the embodiment of FIG. 3, the transition of the SCANEN signal 120 results in the clock domains D1 and D2 receiving clock signal CLK D 118. In this embodiment, both clock domains D1 and D2 are clocked at the same time (i.e., in phase) when the test data is retrieved.

Also in the embodiment of FIG. 3, the clock domains A, B, and C continue to receive the Scan Clock 1 signal 129. Accordingly, during a Capture Stage, all of the synchronous logic in SoC 100 may be clocked on the same signal. In other embodiments, however, this may not be so. For example, as shown in FIG. 3, if a the Scan Operation signal SCAN_OP 142 is transitioned to a low value, then clock domains A, B, and C will receive clock signals CLK A, CLK B, and CLK C, respectively, from MUX A, MUX B, and MUXC, respectively. Of course, other configurations are also possible with control signals of multiplexer technology configured in different ways, with different clock signals provided, and with more or different control signals from Scan Operation signal SCAN_OP 142 and Scan Enable signal SCAN_EN 120.

In some embodiments, scan data, test data, or some other types of data is loaded into the scanned circuitry during the Scan Load Stage using the out of phase Scan Clock signals 129, 122. During the Capture Stage, the circuitry is tested by propagating test data through the scanned circuitry using the in phase Scan Clock signals 129, 122. During the Scan Unload Stage, the propagated values are unloaded or retrieved from the scanned circuitry, again using the out of phase Scan Clock signals 129, 122.

With respect to FIG. 3, during the Capture Stage, the entire large block of synchronous circuitry 108 receives CLK D, which is a functional clock. In this architecture, all of the faults of clock domain D (i.e., clock domain D1 and clock domain D2) functional logic in the block of synchronous circuitry 108 will be detected in the same patterns or in an ATPG pass. Capture Stage power can be contained with the help of clock gating cells inserted during synthesis. In this way while the clock domain D has been partitioned into two scan partitions, the logic can still be tested in a single ATPG run.

In some embodiments, top level pins can be dedicated to one or more scan clocks. In FIG. 3, two dedicated device top level pins are optionally provided as scan clock inputs. In some embodiments, the scan clocks can be skewed at the ATE level to provide various testing scenarios. The magnitude of the inter clock skew (i.e., the amount of phase shift) can be considered during a chip design phase and can be adjusted during a test and implementations phase. In some tested scenarios, clock skew was on the order of several nanoseconds. In one embodiment, clock skew was up to five nanoseconds (5 ns).

As an alternative to externally supplied, out-of-phase scan clock signals such as those illustrated in FIG. 3, some embodiments include an on-board chip delay mechanism. For example, some embodiments pass a scan clock signal through a buffer chain inserted between the scan clock input node and the synchronous logic.

Figure 5:
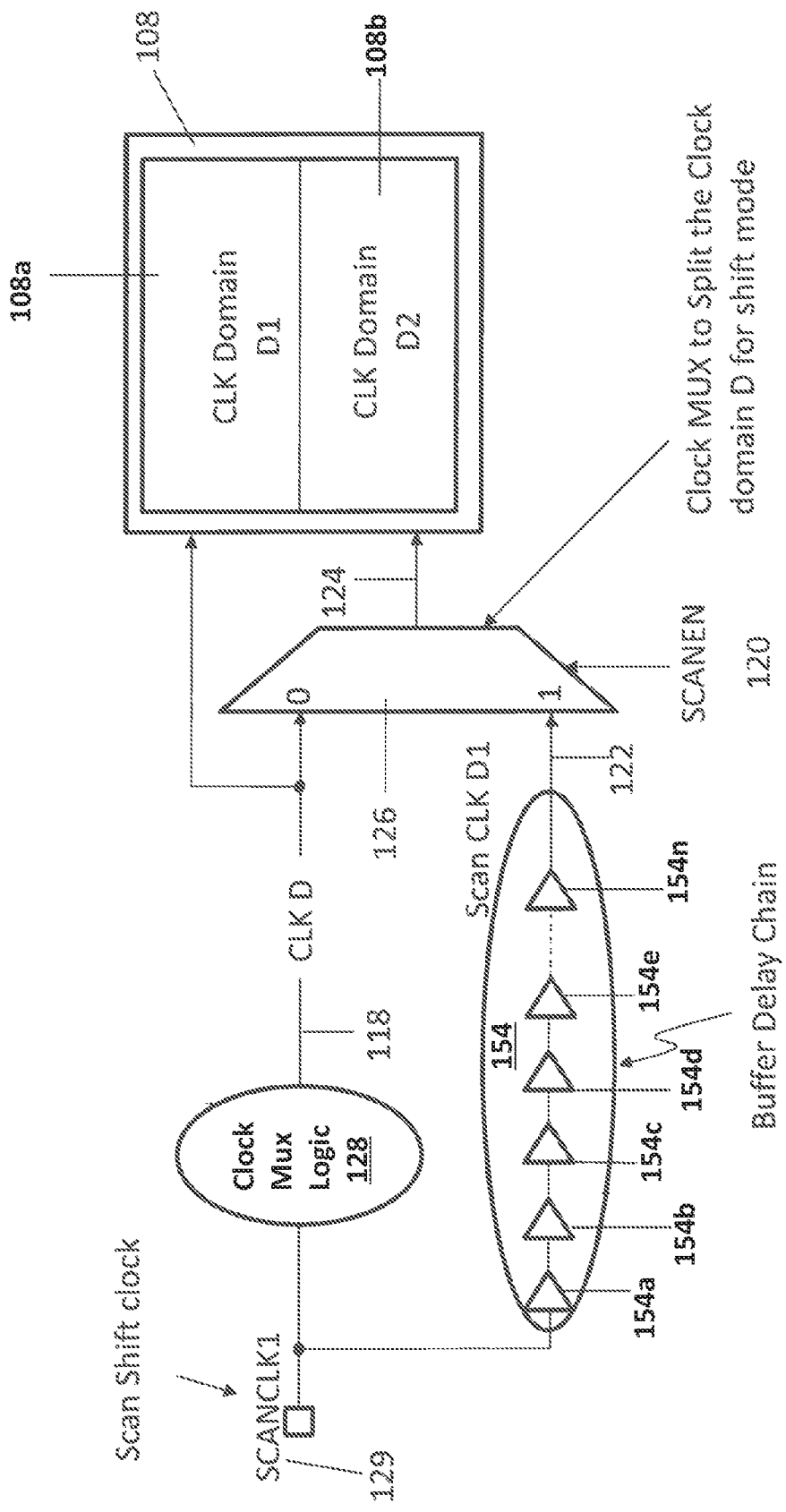
FIG. 5 shows circuitry configured to provide clock signals to a partitioned clock domain.

FIG. 5 shows circuitry configured to provide the delayed Scan Clock 2 signal 122 of FIGS. 2-4. As illustrated in FIGS. 2 and 3, the large block of synchronous logic 108 is partitioned into a clock domain D1 108a and a clock domain D2 108b. Clock domain D1 108a is configured to receive an input CLK D signal 118. Clock domain D2 108b is configured to receive an input clock signal 124, which is received as an output from a multiplexer 126. In FIG. 5, the two inputs of multiplexer 126 are sourced from the same scan clock, which is helpful if the device has a limited number of functional pins available for test operations.

In FIG. 5, multiplexer 126 is configured to receive CLK D 118 at its zero input terminal. Multiplexer 126 is configured to receive scan clock signal CLK D1 122 at its one input terminal. The scan clock signal CLK D1 122 of FIG. 5 may be corresponded to the scan clock CLK D1 122 signal of FIG. 3. In FIG. 3, the CLK D1 signal is received in the system 300 as Scan Clock 2 122 from a dedicated external source. Alternatively, in FIG. 5, the CLK D1 122 signal is derived from Scan Clock 1 129. In both cases, multiplexer 126 will optionally pass the CLK D1 122 signal to clock domain D2 108b of the large block of synchronous logic. The selection in multiplexer 126 is directed by the SCANEN signal 120, which is received at the control input of multiplexer 126.

A buffer delay chain 150 is configured to receive the first Scan Clock 1 signal 129 at its input. Buffer delay chain 150 provides the second Scan Clock 2 signal 122 (i.e., CLK D1) at its output. The buffer delay chain 150 illustrated in FIG. 5 comprises a plurality of serially coupled buffers; illustrated as 154a, 154b, 154c, 154d, 154e, . . . 154n. The first buffer 154a in the delay chain 150 is configured to receive the first Scan Clock 1 signal 129 and to provide a delayed signal to the input of the second buffer 154b. Each of the intermediary buffers, 154b to 154n−1, is configured to receive an increasingly delayed signal 154 provided from the preceding buffer 154a to 154n−2. The final buffer 154n is configured to receive the delay signal from the preceding buffer 154n−1 and to provide the second Scan Clock 2 (i.e., CLK D1) 122 to the multiplexer 126.

Clock multiplexing logic 128 is configured to receive the first Scan Clock 1 signal 129 and to provide the clock signal CLK D 118. In some cases, such as illustrated in FIG. 3, the clock multiplexing logic 128 may be a single multiplexer. In other cases, the clock multiplexing logic 128 of FIG. 5 may include multiplexers, switching circuitry, combinatorial gating logic, or some alternative arrangement of circuitry configured to receive and provide the clocking signals.

In FIG. 5, the large block of synchronous logic 108 is divided into two clock domains, D1 & D2, for shift operations in a test mode while kept as a single clock domain for functional (i.e., non-testing) mode and for capture stages during the test mode. The flip flops and other synchronous circuits of the clock domain D may be part of the same scan partition or may be in different partitions. During a scan stage, when SCANEN has a high value (FIG. 4), clock domain D1 receives the first Scan Clock 1 signal while clock domain D2 receives the out-of-phase delayed signal. The buffer delay chain 150 provides stitching lockup latches for insertion between the flip flops of the shift clock domains D1 and D2 to avoid timing issues and to ease the timing improvement during physical implementation. By splitting the synchronous logic block 108 into two clock domains for the shift operations, the current peak during the shift operations is dispersed by the phase difference between the shift clocks of clock domains D1 and D2.

Figure 6:
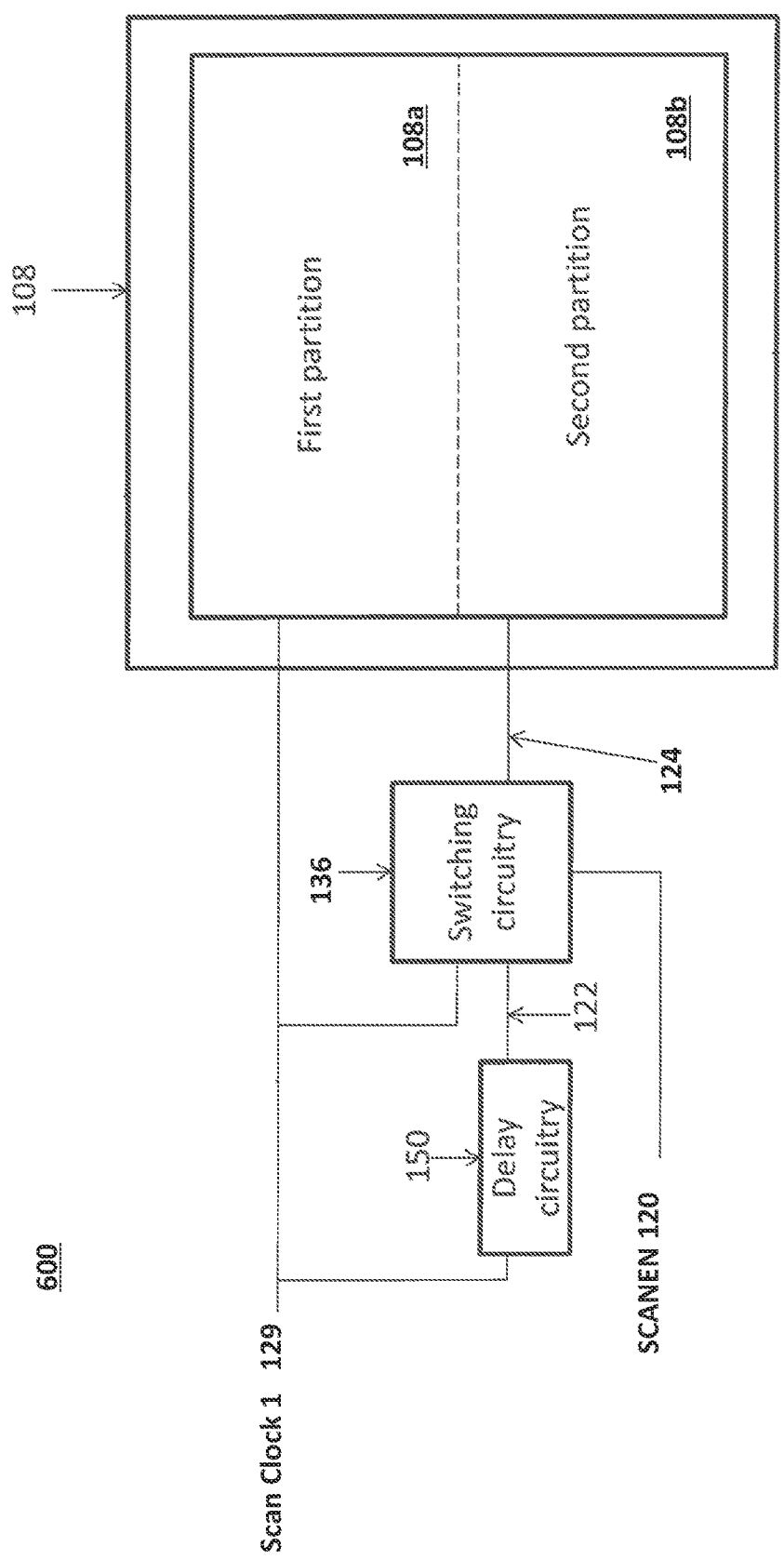
FIG. 6 shows a block diagram of some embodiments.

FIG. 6 shows a block diagram of some embodiments of a system 600 that operates partially or fully in a System on Chip (SoC), Network on Chip, or other block of circuitry in an integrated circuit. A single clock domain of a large block of synchronous logic 108 is partitioned into a first partition 108a and a second partition 108b. A first Scan Clock 1 signal 129 is received as an input by the first partition 108a in testing modes, functional modes, and all other modes of operation of the system 600. The first Scan Clock 1 signal 129 is optionally received by the second partition 108b. A block of switching circuitry 136, directed by a scan enable SCANEN signal 120, may optionally direct the first Scan Clock 1 signal 129 to the second partition 108b. The switching circuitry 136 may include one or more multiplexers or other gating, switching, or logic circuitry.

The switching circuitry 136 of system 600 may optionally direct a second Scan Clock 2 signal 122 to the second partition 108b. The second Scan Clock 2 signal 122 is provided by delay circuitry 150. The delay circuitry 150 may include a configurable series of separate buffers as in FIG. 5. Alternatively, the delay circuitry 150 may be configured in a different way or with different delay devices to provide second Scan Clock 2 signal 122, which is received as in input by the switching circuitry 136. The switching circuitry 136 is configured to provide scan clock signal 124, which is received as an input by the second partition 108b. The switching circuitry 136 is further configured to receive as an input a scan enable signal.

When the system 600 of FIG. 6 is configured in a test mode, a scan stage is entered. The first partition 108a receives the Scan Clock 1 signal 129 signal as a clocking signal in order to propagate data through the partition. The switching circuitry 136 is controlled by the scan enable signal SCANEN 120, which directs the switching circuitry 136 to output the delay signal, Scan Clock 2 122, as the scan clock signal 124. The delay signal is a phase shifted Scan Clock 1 signal 129, which means that there is a delay between the clock signals received by the two partitions of the synchronous logic block 108 during the scan stage. Thus, the data which propagates through the second partition does so out of phase with the data propagating through the first partition. During a capture stage, when values collected during the scan are retrieved, the scan enable signal SCANEN 120 crosses a threshold and switching circuitry 136 outputs the Scan Clock 1 signal 129 signal as the scan clock signal 124. Since both partitions receive Scan Clock 1 signal 129, data may be read from both partitions at the same time.

In one example of an embodiment of FIG. 6 that was tested, an IR Drop analysis was performed. During testing, a skew (i.e., phase shift) of 2 ns was found to reduce the IR Drop by 50 mv. The embodiment tested included a ratio of about 70:30 between the synchronous logic devices (e.g., flip flops) of a first partition, which was scanned with a first Scan Clock signal 129, and a second partition, which was scanned with a second, phase shifted Scan Clock signal 122. It was further discovered that the IR drop can be further reduced by improving the synchronous logic device ratio between the sub blocks (i.e., partitions) or further dividing an entire block into more than 2 sub blocks, while clocking the sub blocks with multi phase shift clocks.

Figure 7:
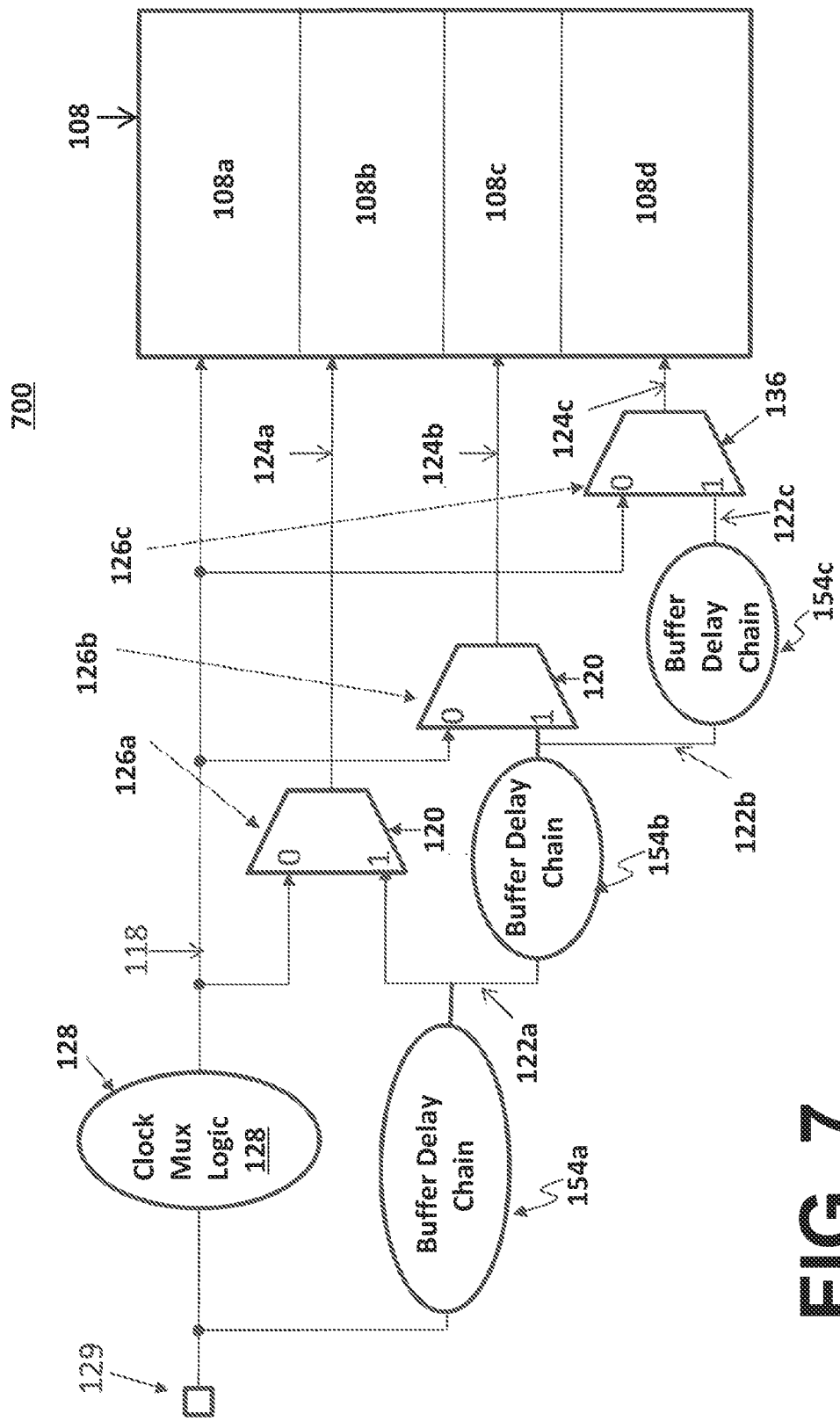
FIG. 7 shows a block diagram of some embodiments.

FIG. 7 shows a system 700 embodiment where a large block of synchronous logic 108 has been arranged into four partitions 108a, 108b, 108c, and 108d. As in other described embodiments, a first Scan Clock 1 signal 129 is received at a terminal that is associated with an externally available pin of the system 700. In other embodiments, the first Scan Clock 1 signal 129 may be provided internally to an internal node. The first Scan Clock 1 signal 129 is input to clock multiplexing logic 128, which is configured to provide the CLK D signal 118 as an output.

The CLK D signal 118 is received as an input by the first partition 108a of the block of synchronous logic 108. The CLK D signal 118 is further received at the zero input of three switching circuits 126a, 126b, and 126c. The three switching circuits 126a, 126b, and 126c are configured to output respective clock signals 124a, 124b, and 124c, which are received by the respective second partition 108a, third partition 108c, and fourth partition 108d.

A first delay circuit 154a is configured to receive the first Scan Clock 1 signal 129 as an input and provide as an output a first delay signal 122a. The first delay signal 122a is received as an input by a second delay circuit 154b and by the "1" input terminal of the switching circuit 126a. The second delay circuit 154b is configured to provide as an output a second delay signal 122b, which is received as an input by a third delay circuit 154c and the "1" input terminal of the second switching circuit 126b. The third delay circuit 154c is configured to provide as an output a third delay signal 122c, which is received as an input by the "1" input terminal of the third switching circuit 126c. The first, second, and third switching circuits 126a, 126b, and 126c, respectively, are configured to be controlled by a scan signal SCANEN 120.

The operation of embodiments shown in FIG. 7 may be similar to that shown in other embodiments described herein. The cascaded delay circuits 154a, 154b, 154c may delay the clock signals such that the pulses used to scan each of the partitions 108a, 108b, 108c, 108d are offset during the load and unload stages. In some embodiments, each delay circuit 154a, 154b, 154c may have the same configuration, and in other embodiments, the delay circuits may have different configuration. Accordingly, a delay in one delay circuit may be either the same or different from the delay in another delay circuit. In some cases, the delay is fixed, and in other cases, the delay is user configurable.

In some embodiments, the phase delay produced by the delay circuits, alone or in combination, may produce a desirable phase relationship between the first Scan Clock 1 signal 129 and the second Scan Clock 2 signal 122. In one embodiment, the phase difference between the first Scan Clock 1 signal 129 and the second Scan Clock 2 signal 122 is greater than zero and less than pi ($\pi$). In one embodiment, the phase difference between the first Scan Clock 1 signal 129 and the second Scan Clock 2 signal 122 is equal to pi ($\pi$). In one embodiment, the phase difference between the first Scan Clock 1 signal 129 and the second Scan Clock 2 signal 122 is greater than pi ($\pi$) and less than two times pi ($2\pi$). In yet other embodiments the relationship between the first Scan Clock 1 signal 129 and the second Scan Clock 2 signal 122 a numerical delay in time or some other relationship.

Although FIG. 7 illustrates three delay circuits, more or fewer delay circuits may be employed. Accordingly, more or fewer than three switching circuits 126a, 126b, 126c may be employed, and the large block of synchronous logic 108 may be arranged as more than four partitions or fewer than four partitions. In some cases, the number of partitions, switches, and delay circuits is user configurable. In some cases, the boundaries of the partitions are user configurable.

In some embodiments, the load stage may last for at least one cycle of each of the scan clocks.

The switching circuitry 126 may comprise a switch, a multiplexer or any other selecting or switching means. Naturally, the polarity of the switching circuitry may also take any form. That is, while the embodiments illustrated in the accompanying figures illustrate a "0" (zero) terminal in a multiplexer passing a first Scan Clock 1 signal 129 to a block of synchronous logic, a "1" (one) terminal of the multiplexer could also have been used. Thus, the polarity and direction of signal edges may be conformed to any acceptable circuitry without diverging from the concepts presented in the disclosure. Additionally, it is understood that the terminals of the switching circuitry as described herein may be nodes, pads, or some other internal point of coupling.

The delay circuitry 150 may comprise buffers, logic gates or any other delay means.

In some embodiments the synchronous elements may comprise flip flops.

In some embodiments the test clock may be configured such that the rising and falling edges of the first clock signal occur prior to the rising and falling edges of the delayed clock signal. In some embodiments the test clock may be configured such that the rising edge of the delayed clock occurs between the rising and falling edges of the first clock.

In some embodiments the clock domains may comprise synchronous and asynchronous circuitry.

Some embodiments may use wire bond packages.

In some embodiments at least one of the clock domains A, B and C may be scanned before, at the same time, or after at least one of the partitions of clock domain D. Accordingly, the order of scanning may be changed from that illustrated and described herein.

In some embodiments, multiphase clocks are applied to a clock domain during the shift phase to scatter the switching activity. This may have the peak in current demand at the shift clock edges.

In some embodiments two or more of the domains may receive different clock signals that have the same frequency. These domains may be tested using the same test clock signal as described in some embodiments.

Some embodiments may comprise two or more very large clock domains. Each of these large clock domains may be partitioned and tested either separately or together.

By employing the strategies and embodiments disclosed herein, several benefits are achieved. For example, shift stage IR Drop in integrated circuits having large synchronous blocks was reduced very effectively. Test time reduction has been achieved since the entire block can be tested in a single pass, and split testing methodology is not required. Increased Test Coverage is achieved since the entire block is tested in one pass. Scan implementation is simple when compared to scan partitioning. Even when the synchronous logic block is very large, the testing is reasonably managed by further partitioning into more shift clock domains that have spread shift clocks. The techniques presented herein can be scaled even to very large devices with selective large clock domain(s).

Unless the context requires otherwise, throughout the specification and claims which follow, the word "comprise" and variations thereof, such as, "comprises" and "comprising" are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

In the foregoing description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electronic systems have not been shown or described in detail to avoid unnecessarily obscuring descriptions of the embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a first clock input arranged to receive a first clock signal;
   a second clock input arranged to receive a second clock signal;
   a switching circuit coupled to the first and second clock inputs, the switching circuit arranged to receive the first and second clock signals and further arranged to pass at least one of the first and second clock signals based on a functional mode of the apparatus or a test mode of the apparatus;
   a large block of synchronous logic coupled to the switching circuit, the large block of synchronous logic arranged to include at least a first partition and a second partition, the first partition configured to receive the first clock signal during the functional mode and the first partition configured to receive the first clock signal during the test mode, and via the switching circuit, the second partition configured to receive the first clock signal during the functional mode and the second partition configured to receive the second clock signal during the test mode, wherein said second clock signal has a same frequency as said first clock signal and said second clock signal has a different phase from said first clock signal.

2. The apparatus of claim 1 wherein said second partition is configured to receive said second clock signal during a scan stage in the test mode and said first clock signal during a capture stage in the test mode.

3. The apparatus of claim 1, wherein the switching circuit includes:
multiplexor switching circuitry, the multiplexor switching circuitry configured to receive said first clock signal, said second clock signal, and a control signal, the multiplexor switching circuitry further configured to output one of said first clock signal and said second clock signal in dependence on said control signal.

4. The apparatus of claim 1 wherein the phase difference between said first clock signal and said second clock signal is one of:
greater than zero and less than $\pi$;
equal to $\pi$; and
greater than $\pi$ and less than $2\pi$.

5. The apparatus of claim 1 wherein rising and falling edges of the second clock signal are more than 3 nanoseconds from the rising and falling edges of the first clock signal.

6. The apparatus of claim 1 wherein said large block of synchronous logic includes at least 200,000 flip flops.

7. The apparatus of claim 6 wherein said large block of synchronous logic includes at least 500,000 flip flops.

8. The apparatus of claim 1 wherein said large block of synchronous logic includes at least one further partition configured to receive a respective at least one further clock signal, said at least one further clock signal having a frequency different from said first and second clock signals.

9. The apparatus of claim 1 further comprising:
delay circuitry, said delay circuitry configured to receive said first clock signal, generate said second clock signal by delaying said first clock signal by a time period, and output said second clock signal.

10. A method to test an apparatus, comprising:
operating a large block of synchronous logic during two modes, the two modes including a functional mode and a test mode;
providing a first clock signal to a first partition of the large block of synchronous logic during both of the two modes;
operating a switching circuit according to the two modes wherein the switching circuit is arranged in a first configuration when the large block of synchronous logic is operating in the functional mode and wherein the switching circuit is arranged in a second configuration when the large block of synchronous logic is operating in the test mode;
via the switching circuit, providing the first clock signal to a second partition of the large block of synchronous logic during the functional mode; and
via the switching circuit, providing a second clock signal to the second partition of the large block of synchronous logic during the test mode, wherein said second clock signal has a same frequency as said first clock signal and said second clock signal has a different phase from said first clock signal.

11. The method of claim 10, comprising:
receiving at said second partition said second clock signal during a scan stage; and
receiving at said second partition said first clock signal during a capture stage.

12. The method of claim 10 wherein providing said second clock signal comprises:
delaying said first clock signal such that the phase difference between said first clock signal and said second clock signal is between zero and $2\pi$.

13. The method of claim 10 wherein providing said second clock signal comprises:
delaying said second clock signal such that rising edges of the second clock signal are more than 2 nanoseconds from the rising edges of the first clock signal.

14. An integrated circuit, comprising:
a large block of synchronous logic, the large block of synchronous logic arranged to include at least a first partition and a second partition, the first partition configured to receive a first clock signal and the second partition configured to receive the first clock signal when the large block of synchronous logic is operating in a functional mode and a second clock signal when the large block of synchronous logic is operating in a test mode; and
a switching circuit, the switching circuit configured to receive the first clock signal at a first node, the switching circuit configured to receive a delayed clock signal at a second node, and based on whether the large block of synchronous logic is operating in the functional mode or the test mode, the switching circuit configured to pass one of the first clock signal and the delayed clock signal as the second clock signal from an output node.

15. The integrated circuit of claim 14, comprising:
a delay circuit, the delay circuit configured to provide the delayed clock signal wherein the delayed clock signal has a same frequency as the first clock signal and the delayed clock signal has a different phase from said first clock signal.

16. The integrated circuit of claim 15 wherein the delay circuit includes a plurality of serially coupled buffers.

17. The integrated circuit of claim 14, comprising:
a first terminal configured to receive the first clock signal from a first source external to the integrated circuit; and
a second terminal configured to receive the delayed clock signal from a second source external to the integrated circuit.

18. The integrated circuit of claim 14 wherein the large block of synchronous logic includes at least one further partition configured to receive a respective at least one further clock signal, said at least one further clock signal having a phase different from the first clock signal and the second clock signal.

19. The integrated circuit of claim 14 wherein the switching circuit is configured to pass the delayed clock signal to the output node during a scan stage and the switching circuit is configured to pass the first clock signal to the output node during a capture stage.

20. The integrated circuit of claim 19 wherein the second partition includes at least 80 percent of the synchronous logic of the large block of synchronous logic.

* * * * *